(12) United States Patent
Yang et al.

(10) Patent No.: US 11,626,578 B2
(45) Date of Patent: Apr. 11, 2023

(54) BORDERLESS DISPLAY WITH LIGHT-BENDING STRUCTURES

(71) Applicant: Apple Inc., Cupertino, CA (US)

(72) Inventors: Tseng-Mau Yang, Mississauga (CA); Christopher D. Prest, San Francisco, CA (US); Dale N. Memering, New York, NY (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/481,751

(22) Filed: Sep. 22, 2021

(65) Prior Publication Data
US 2022/0006060 A1 Jan. 6, 2022

Related U.S. Application Data

(63) Continuation of application No. 16/806,224, filed on Mar. 2, 2020, now Pat. No. 11,165,046, which is a
(Continued)

(51) Int. Cl.
*H01L 51/52* (2006.01)
*G02F 1/1333* (2006.01)
(Continued)

(52) U.S. Cl.
CPC .... *H01L 51/5275* (2013.01); *G02F 1/133308* (2013.01); *G02F 1/133526* (2013.01);
(Continued)

(58) Field of Classification Search
CPC ............. H01L 51/5275; H01L 51/5237; H01L 27/323; G02F 1/133314; G02F 1/133317;
(Continued)

(56) References Cited

U.S. PATENT DOCUMENTS

| | | |
|---|---|---|
| 4,904,049 A | 2/1990 | Hegg |
| 6,927,908 B2 | 8/2005 | Stark |

(Continued)

FOREIGN PATENT DOCUMENTS

| | | |
|---|---|---|
| EP | 2306437 A1 | 6/2011 |
| EP | 2423906 B1 | 2/2012 |

(Continued)

*Primary Examiner* — Angela K Davison
(74) *Attorney, Agent, or Firm* — Treyz Law Group, P.C.; G. Victor Treyz; David K. Cole

(57) ABSTRACT

An electronic device may be provided with a display mounted in a housing. The display may have an array of display pixels that provide image light to a user. The array of display pixels may form an active display structure with a rectangular shape. The rectangular active display structure may be surrounded by an inactive border region. Optical structures such as a sheet of glass or another optical member may have portions that are configured to bend light from the display pixels along the periphery of the active display structure. The optical member may have an area that is larger than the area of the active display structure, so that the presence of the optical member may serve to enlarge the apparent size of the display. Solidified liquid polymer may be used to support the optical structures and may be interposed between the optical structures and the active display structures.

11 Claims, 18 Drawing Sheets

Related U.S. Application Data continuation of application No. 15/234,955, filed on Aug. 11, 2016, now Pat. No. 10,600,997, which is a continuation of application No. 13/631,024, filed on Sep. 28, 2012, now abandoned.

(51) Int. Cl.
  *G02F 1/1335* (2006.01)
  *H01L 27/32* (2006.01)

(52) U.S. Cl.
  CPC .......... *H01L 27/323* (2013.01); *H01L 51/525* (2013.01); *H01L 51/5237* (2013.01); *G02F 1/133331* (2021.01)

(58) Field of Classification Search
  CPC .......... G02F 1/13332; G02F 1/133526; G02F 1/133331
  See application file for complete search history.

(56) References Cited

U.S. PATENT DOCUMENTS

| | | | |
|---|---|---|---|
| 7,551,372 B2 | 6/2009 | Xun et al. | |
| 7,663,715 B2 | 2/2010 | Jin et al. | |
| 7,856,161 B2 | 12/2010 | Tabor | |
| 8,085,216 B2 | 12/2011 | Miller | |
| 8,368,729 B2 | 2/2013 | Watanabe | |
| 8,472,114 B2 | 6/2013 | Watanabe | |
| 8,541,934 B2 | 9/2013 | Watanabe et al. | |
| 8,690,414 B2 | 4/2014 | Tomotoshi et al. | |
| 8,692,737 B2 | 4/2014 | Watanabe et al. | |
| 2001/0046365 A1 | 11/2001 | Bohle et al. | |
| 2002/0000967 A1 | 1/2002 | Huston et al. | |
| 2006/0007369 A1 | 1/2006 | Jin et al. | |
| 2006/0077544 A1 | 4/2006 | Stark | |
| 2008/0094700 A1 | 4/2008 | Uehaea | |
| 2008/0309633 A1 | 12/2008 | Hotelling et al. | |
| 2009/0059366 A1 | 3/2009 | Imai | |
| 2009/0103191 A1 | 4/2009 | Xun et al. | |
| 2011/0025594 A1 | 2/2011 | Watanabe | |
| 2011/0102302 A1 | 5/2011 | Watanabe | |
| 2011/0109535 A1 | 5/2011 | Wantanabe | |
| 2011/0109622 A1 | 5/2011 | Son et al. | |
| 2011/0242686 A1 | 10/2011 | Watanabe | |
| 2011/0255301 A1 | 10/2011 | Watanabe | |
| 2011/0279383 A1 | 11/2011 | Wilson et al. | |
| 2011/0285934 A1 | 11/2011 | Watanabe | |
| 2012/0008340 A1 | 1/2012 | Tomotoshi et al. | |
| 2012/0026112 A1 | 2/2012 | Seok et al. | |
| 2012/0049718 A1 | 3/2012 | Watanabe et al. | |
| 2013/0083080 A1 | 4/2013 | Rappoport et al. | |
| 2013/0242230 A1 | 9/2013 | Watanabe | |
| 2013/0342971 A1 | 12/2013 | Jacobs et al. | |
| 2014/0092028 A1 | 4/2014 | Prest et al. | |
| 2014/0362328 A1 | 12/2014 | Kuroki et al. | |
| 2015/0138484 A1* | 5/2015 | Watanabe ......... G02F 1/133308 349/58 |

FOREIGN PATENT DOCUMENTS

| | | |
|---|---|---|
| EP | 2439582 A1 | 11/2012 |
| JP | 60227232 A | 11/1985 |
| WO | 2002042838 A1 | 5/2002 |
| WO | 2009122691 A1 | 10/2009 |
| WO | 2010055671 A1 | 5/2010 |
| WO | 2010070871 A1 | 6/2010 |
| WO | 2010122781 A1 | 10/2010 |

* cited by examiner

BORDERLESS DISPLAY WITH LIGHT-BENDING STRUCTURES

This application is a continuation of U.S. patent application Ser. No. 16/806,224, filed Mar. 2, 2020, which is a continuation of U.S. patent application Ser. No. 15/234,955, filed Aug. 11, 2016, now U.S. Pat. No. 10,600,997, which is a continuation of U.S. patent application Ser. No. 13/631,024, filed Sep. 28, 2012, which are hereby incorporated by reference herein in their entireties.

BACKGROUND

This relates generally to electronic devices, and more particularly, to electronic devices with displays.

Electronic devices often include displays. For example, cellular telephones and portable computers often include displays for presenting information to a user. An electronic device may have a housing such as a housing formed from plastic or metal. Components for the electronic device such as display components may be mounted in the housing.

It can be challenging to incorporate a display into the housing of an electronic device. Size and weight are often important considerations in designing electronic devices. If care is not taken, displays may be bulky or may be surrounded by overly large borders. The housing of an electronic device can be adjusted to accommodate a bulky display with large borders, but this can lead to undesirable enlargement of the size and weight of the housing and unappealing device aesthetics.

It would therefore be desirable to be able to provide improved displays for electronic devices.

SUMMARY

An electronic device may be provided with a display. The display may be mounted in a housing. The display may have an array of display pixels that provide image light to a user. Display pixels may be organic light-emitting diode pixels, may be backlit liquid crystal display pixels, or may be display pixels of other types.

The array of display pixels may form an active display structure with a rectangular shape. The rectangular active display structure may be surrounded by an inactive display structure border region. Optical structures such as a sheet of glass or other optical member may have portions that are configured to bend light from the display pixels that are located along the periphery of the active display structure.

The optical member may have an area that is larger than area of the active display structure. The presence of the optical member and the portions of the optical member that are configured to bend the light may serve to enlarge the apparent size of the display. Solidified liquid polymer may be used to support the optical structures and may be interposed between the optical structures and the active display structures. A display cover layer may overlap the optical member. A touch sensor and coating layers may be included in the display.

Further features of the invention, its nature and various advantages will be more apparent from the accompanying drawings and the following detailed description of the preferred embodiments.

DETAILED DESCRIPTION

Electronic devices may include displays. The displays may be used to display images to a user. Illustrative electronic devices that may be provided with displays are shown in FIGS. 1, 2, and 3.

Figure 1:
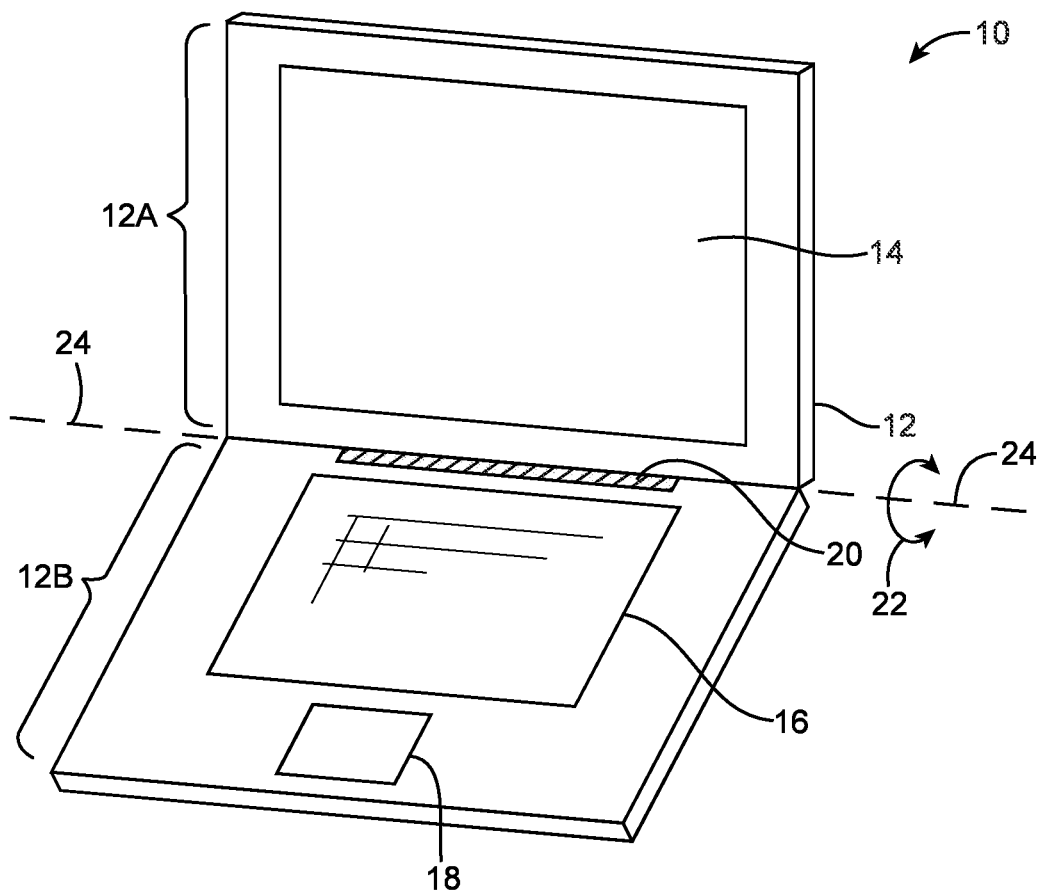
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
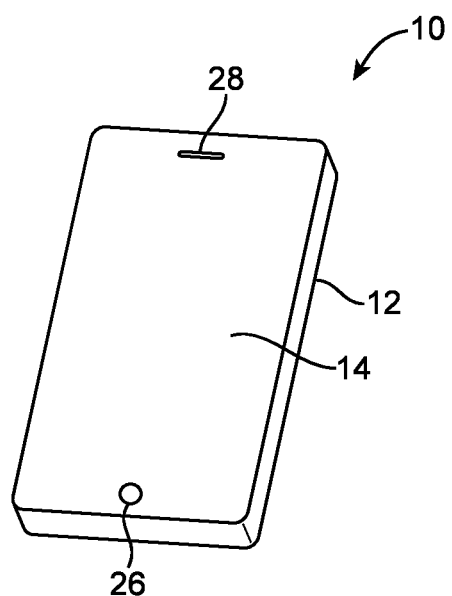
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have a display cover layer or other exterior layer that includes openings for components such as button 26. Openings may also be formed in a display cover layer or other display layer to accommodate a speaker port (see, e.g., speaker port 28 of FIG. 2).

Figure 3:
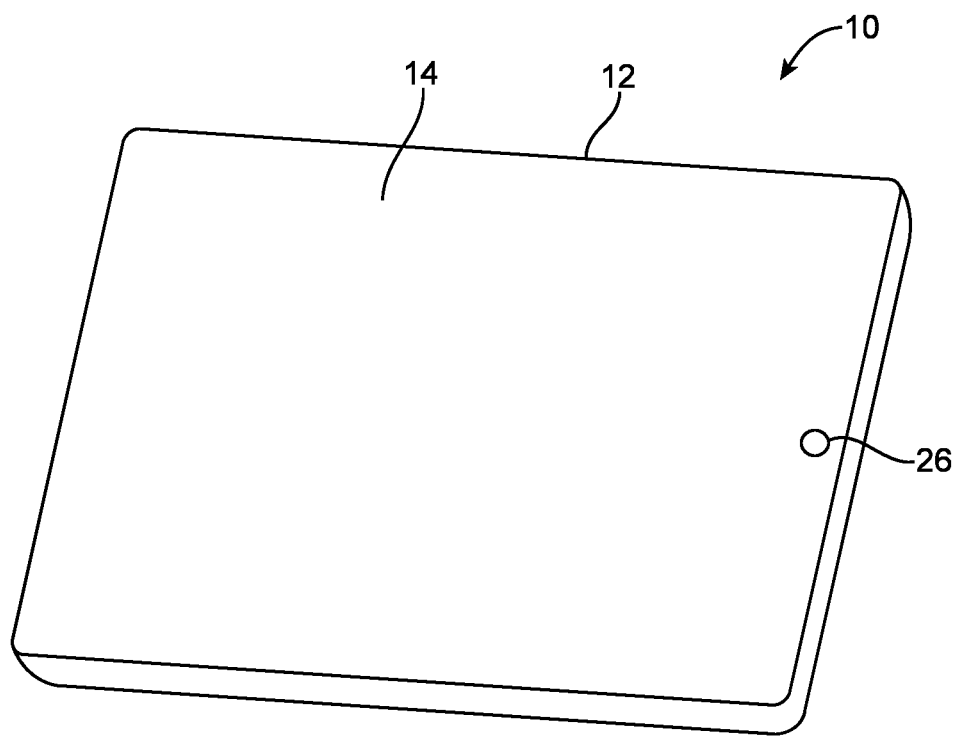
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have a cover layer or other external layer with an opening to accommodate button 26 (as an example).

The illustrative configurations for device 10 that are shown in FIGS. 1, 2, and 3 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Displays for device 10 may, in general, include image pixels formed from light-emitting diodes (LEDs), organic LEDs (OLEDs), plasma cells, electrowetting pixels, electrophoretic pixels, liquid crystal display (LCD) components, or other suitable image pixel structures. In some situations, it may be desirable to use LCD components to form display 14, so configurations for display 14 in which display 14 is a liquid crystal display are sometimes described herein as an example. It may also be desirable to provide displays such as display 14 with backlight structures, so configurations for display 14 that include a backlight unit may sometimes be described herein as an example. Other types of display technology may be used in device 10 if desired. The use of liquid crystal display structures and backlight structures in device 10 is merely illustrative.

A display cover layer may cover the surface of display 14 or a display layer such as a color filter layer or other portion of a display may be used as the outermost (or nearly outermost) layer in display 14. A display cover layer or other outer display layer may be formed from a transparent glass sheet, a clear plastic layer, or other transparent structures.

Touch sensor components such as an array of capacitive touch sensor electrodes formed from transparent materials such as indium tin oxide may be formed on the underside of a display cover layer, may be formed on a separate display layer such as a glass or polymer touch sensor substrate, or may be integrated into other display layers (e.g., substrate layers such as a thin-film transistor layer).

Figure 4:
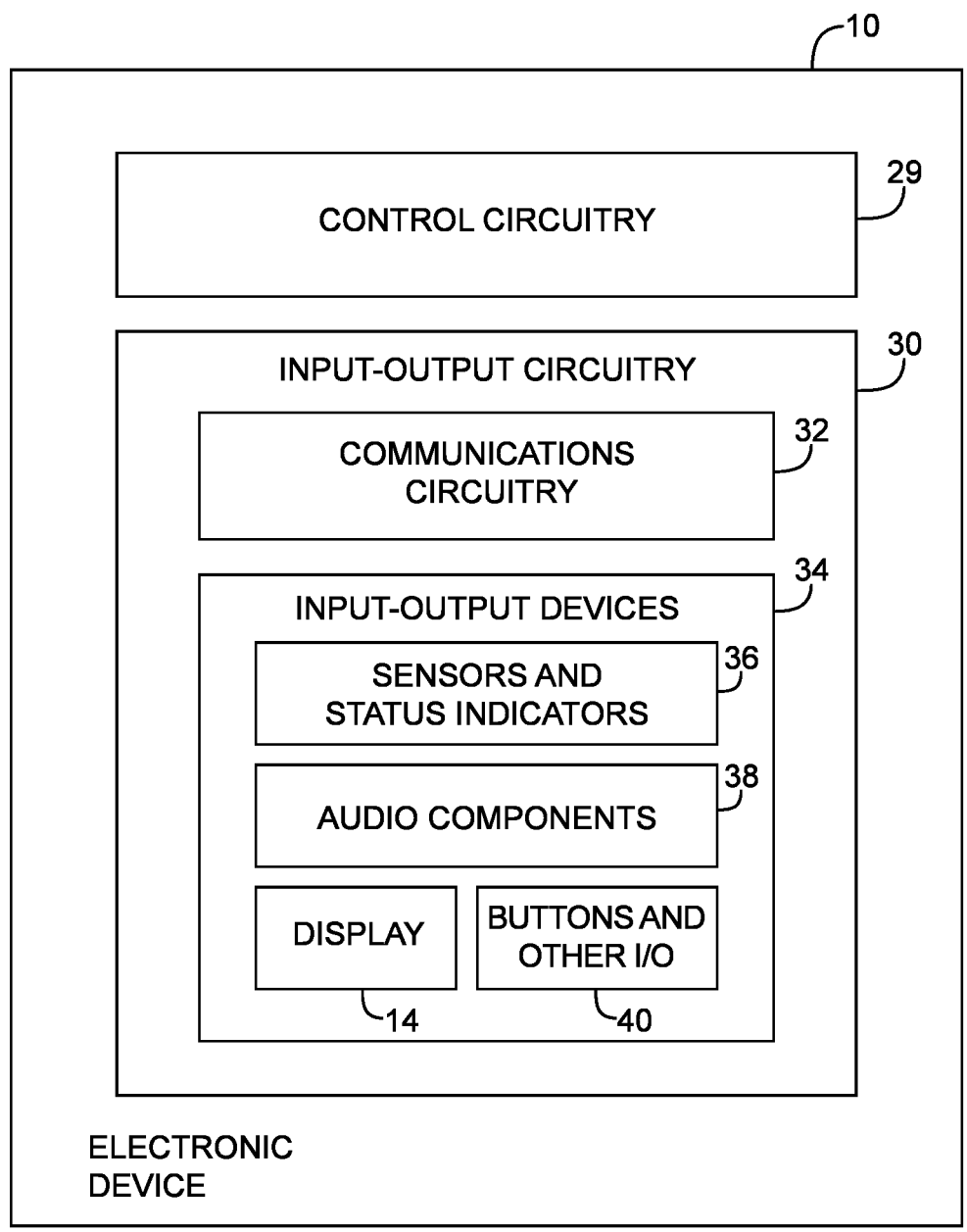
FIG. 4 is a schematic diagram of an illustrative electronic device with a display in accordance with an embodiment of the present invention.

A schematic diagram of an illustrative configuration that may be used for electronic device 10 is shown in FIG. 4. As shown in FIG. 4, electronic device 10 may include control circuitry 29. Control circuitry 29 may include storage and processing circuitry for controlling the operation of device 10. Control circuitry 29 may, for example, include storage such as hard disk drive storage, nonvolatile memory (e.g., flash memory or other electrically-programmable-read-only memory configured to form a solid state drive), volatile memory (e.g., static or dynamic random-access-memory), etc. Control circuitry 29 may include processing circuitry based on one or more microprocessors, microcontrollers, digital signal processors, baseband processors, power management units, audio codec chips, application specific integrated circuits, etc.

Control circuitry 29 may be used to run software on device 10, such as operating system software and application software. Using this software, control circuitry 29 may present information to a user of electronic device 10 on display 14. Display 14 may contain an array of display pixels (e.g., liquid crystal display pixels) that are organized in rows and columns. Control circuitry 29 may be used to display content for a user of device 10 on the array of display pixels in display 14.

Input-output circuitry 30 may be used to allow data to be supplied to device 10 and to allow data to be provided from device 10 to external devices. Input-output circuitry 30 may include communications circuitry 32. Communications circuitry 32 may include wired communications circuitry for supporting communications using data ports in device 10. Communications circuitry 32 may also include wireless communications circuits (e.g., circuitry for transmitting and receiving wireless radio-frequency signals using antennas).

Input-output circuitry 30 may also include input-output devices 34. A user can control the operation of device 10 by supplying commands through input-output devices 34 and may receive status information and other output from device 10 using the output resources of input-output devices 34.

Input-output devices 34 may include sensors and status indicators 36 such as an ambient light sensor, a proximity sensor, a temperature sensor, a pressure sensor, a magnetic sensor, an accelerometer, and light-emitting diodes and other components for gathering information about the environment in which device 10 is operating and providing information to a user of device 10 about the status of device 10.

Audio components 38 may include speakers and tone generators for presenting sound to a user of device 10 and microphones for gathering user audio input.

Display 14 (e.g., the array of display pixels in display 14) may be used to present images for a user such as text, video, and still images. Sensors 36 may include a touch sensor array that is formed as one of the layers in display 14.

User input may be gathered using buttons and other input-output components 40 such as touch pad sensors, buttons, joysticks, click wheels, scrolling wheels, touch sensors such as sensors 36 in display 14, key pads, keyboards, vibrators, cameras, and other input-output components.

Figure 5:
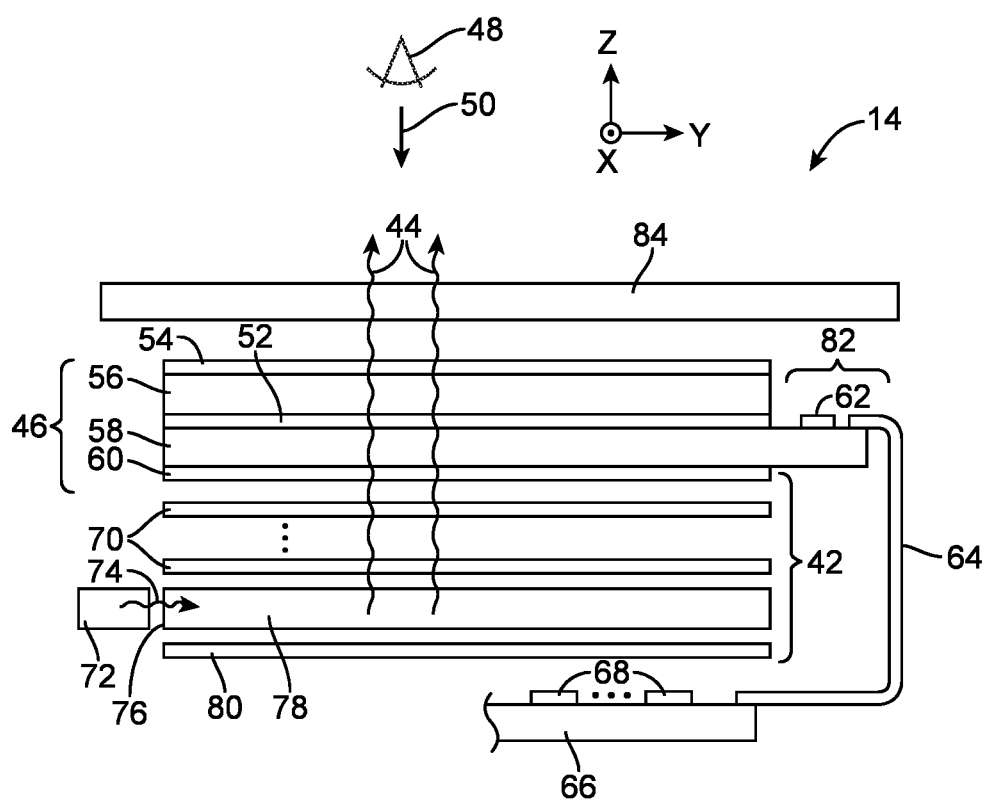
FIG. 5 is a cross-sectional side view of an illustrative display in accordance with an embodiment of the present invention.

A cross-sectional side view of an illustrative configuration that may be used for display 14 of device 10 (e.g., for display 14 of the devices of FIG. 1, FIG. 2, or FIG. 3 or other suitable electronic devices) is shown in FIG. 5. As shown in FIG. 5, display 14 may include backlight structures such as backlight unit 42 for producing backlight 44. During operation, backlight 44 travels outwards (vertically upwards in dimension Z in the orientation of FIG. 5) and passes through display pixel structures in display layers 46. This illuminates any images that are being produced by the display pixels for viewing by a user. For example, backlight 44 may illuminate images on display layers 46 that are being viewed by viewer 48 in direction 50.

Display 14 may, if desired, have one or more optical structures that are located above display layers 46. For example, display 14 may have a display cover layer such as display cover layer 84. Display cover layer 84 may be formed from a layer of clear glass, a transparent sheet of plastic, or other transparent structure. Display cover layer 84 may be mounted in housing 12 (e.g., using housing sidewalls). During operation, light 44 may pass through the array of display pixels formed from display layers 46 and display cover layer 84 for viewing by user 48.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types. Display layers 46 may sometimes be referred to as a display module, a display, or an array of display pixels. The image light (light 44) that passes through the array of display pixels is used in displaying content on display 14 for user 48.

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of thin-film transistors and associated electrodes (display pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer.

During operation of display 14 in device 10, control circuitry 29 (e.g., one or more integrated circuits such as components 68 on printed circuit 66 of FIG. 5) may be used to generate information to be displayed on display 14 (e.g., display data). The information to be displayed may be conveyed from circuitry 68 to display control circuitry such as display driver integrated circuit 62 using a signal path such as a signal path formed from conductive metal traces in flexible printed circuit 64 (as an example).

Display driver integrated circuit 62 may be mounted on thin-film-transistor layer driver ledge 82 or elsewhere in device 10. During operation of display 14, display driver circuitry 62 and/or other display control circuitry such as gate driver circuitry formed on substrate 58 or coupled to substrate 58 may be used in controlling the array of display pixels in layers 46 (e.g., using a grid of vertical data lines and horizontal gate lines).

A flexible printed circuit cable such as flexible printed circuit 64 may be used in routing signals between printed circuit 66 and thin-film-transistor layer 58. If desired, display driver integrated circuit 62 may be mounted on printed circuit 66 or flexible printed circuit 64. Printed circuit 66 may be formed from a rigid printed circuit board (e.g., a layer of fiberglass-filled epoxy) or a flexible printed circuit (e.g., a flexible sheet of polyimide or other flexible polymer layer).

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide plate 78 and may be distributed in dimensions X and Y throughout light guide plate 78 due to the principal of total internal reflection. Light guide plate 78 may include light-scattering features such as pits or bumps. The light-scattering features may be located on an upper surface and/or on an opposing lower surface of light guide plate 78.

Light 74 that scatters upwards in direction Z from light guide plate 78 may serve as backlight 44 for display 14. Light 74 that scatters downwards may be reflected back in the upwards direction by reflector 80. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide plate 78 and reflector 80. For example, if light guide plate 78 has a rectangular footprint in the X-Y plane of FIG. 5, optical films 70 and reflector 80 may have a matching rectangular footprint. Display layers 46 and the other display structures of FIG. 5 typically have rectangular shapes with four peripheral edges, but display configurations with other shapes may be used in forming display 14 if desired.

Figure 6:
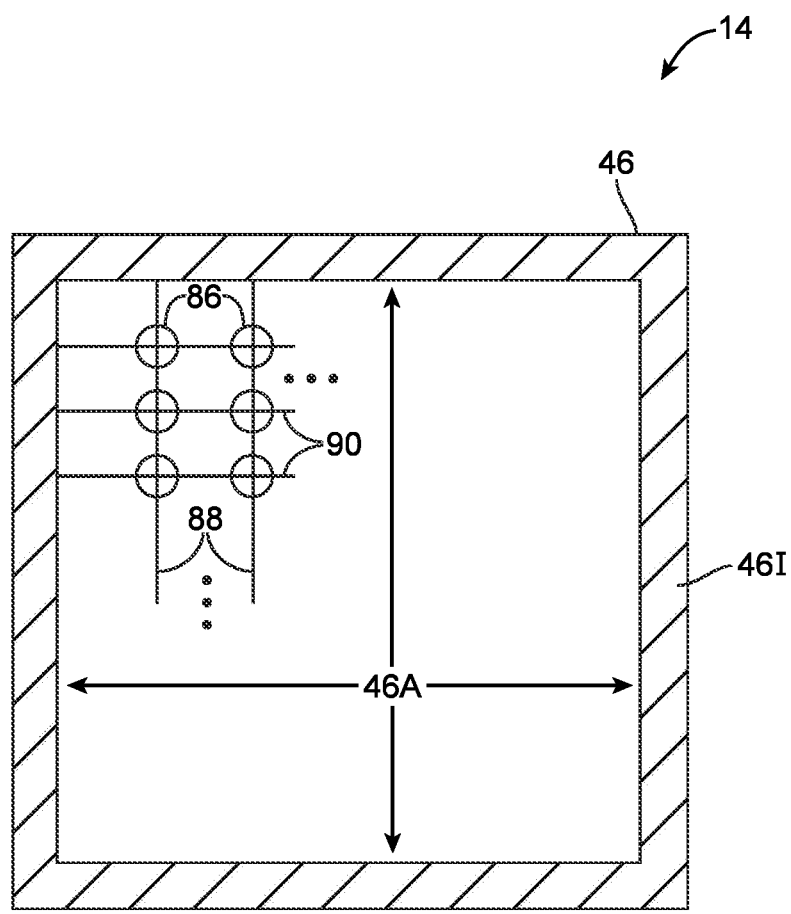
FIG. 6 is a top view of illustrative display layers in a display having an active region with an array of display pixels and an inactive border region in accordance with an embodiment of the present invention.

As shown in FIG. 6, display structures 46 of display 14 may include a plurality of display pixels 86. Display pixels 86 may be organized in rows and columns. Display control circuitry may be used in controlling the operation of display pixels 86 using signal lines such as data lines 88 and gate lines 90. In liquid crystal displays, display pixels 86 may each contain an electrode for applying an electric field to an associated portion of liquid crystal layer 52 (FIG. 5) and a thin-film (amorphous silicon or polysilicon) transistor for controlling the magnitude of the signal applied to the electrode and therefore the magnitude of the electric field. In other types of displays, display pixels 86 may be formed from other types of structures (e.g., organic light-emitting diodes, etc.).

Lines 90 may be coupled to the gates of the thin-film transistors and may sometimes be referred to as gate lines. Lines 88 may be coupled to the sources of the thin-film transistors and may sometimes be referred to as source lines or data lines. Gate driver circuitry (e.g., thin-film transistor gate driver circuitry) may be coupled to gate lines 90. Display driver circuitry that produces data signals for lines 88 (e.g., a display driver integrated circuit) may be coupled to data lines 88.

Gate driver circuitry, one or more display driver integrated circuits, traces for distributing gate and data signals and other display control signals, and other display control circuitry may be formed in inactive region 461 of display 14 and display structures 46. As an example, a display driver integrated circuit may be mounted along the upper segment of inactive region 461, whereas gate driver thin-film circuitry may be formed along the left and right segments of inactive region 461. During operation of display 14, display pixels 86 may display images for a user, so the portion of display structures 46 containing display pixels 86 may sometimes be referred to as active display structures or the active area of display 14. The metal traces and other display control circuit structures in inactive region 461 do not display any images, so this portion of structures 46 may sometimes be referred to as inactive display structures.

Inactive region 461 may form a border that surrounds some or all of active area 46A. For example, inactive region 461 may have a rectangular ring shape of the type shown in FIG. 6 having opposing upper and lower border segments and left and right border segments. To provide display 14 with a borderless appearance, display 14 may be provided with optical structures such as glass layers with curved or angled surfaces. The optical structures may be configured to bend and therefore guide light that is emitted from the array of display pixels 86 in active area 46A into a portion of display 14 that overlaps inactive area 461. By using optical structures to bend light from active area 46A, content may be displayed in portions of display 14 that overlap inactive regions 461, providing display 14 with a borderless or near borderless appearance.

The optical structures that are used to enhance the apparent size of display 14 may be formed from transparent materials such as clear glass or plastic structures. As an example, the optical structures may be formed from sheets of clear glass or plastic material or from glass, plastic, or other transparent material of other shapes. Optical structures with curved surfaces for bending light may be formed using molding equipment, slumping equipment, machining equipment, or other tools for shaping clear material.

Figure 7:
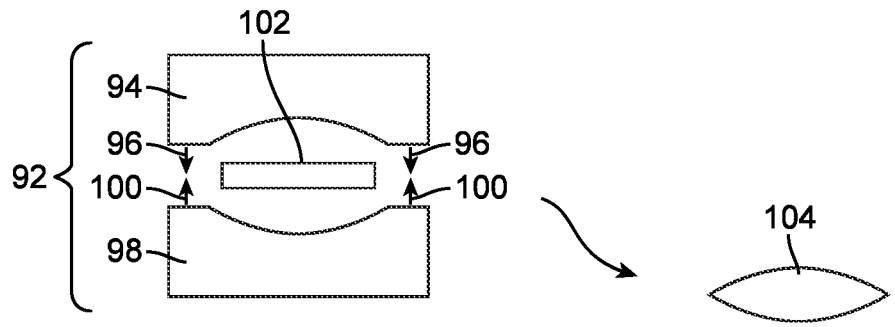
FIG. 7 is a diagram showing how a mold may be used to form display structures such as glass structures with curved surfaces in accordance with an embodiment of the present invention.

FIG. 7 is a diagram showing how a mold may be used to form optical structures with curved surfaces for bending light in display 14. As shown in FIG. 7, molding equipment 92 may include mold structures such as upper mold structures 94 and lower mold structures 98. Structures such as mold structures 94 and 98 may be heated. Optical material 102 (e.g., glass, plastic, ceramic, etc.) may be molded between the opposing surfaces of mold structures 94 and 98 (e.g., when upper mold structure 94 is moved in direction 96 and/or when lower mold structures 98 is moved in direction 100). If desired, molding operations may also involve injection molding techniques. By molding material 102 with molding equipment 92, optical structures 104 that have curved or angle surfaces may be formed.

Figure 8:
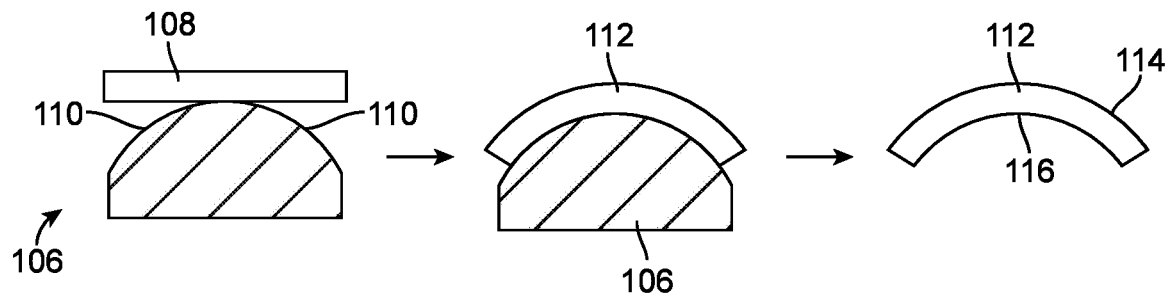
FIG. 8 is a diagram showing how a slumping process may be used to form display structures such as glass structures with curved surfaces in accordance with an embodiment of the present invention.

As shown in the illustrative configuration of FIG. 8, a slumping process may be used in forming optical structures with curved surfaces for bending light in display 14. Slumping equipment 106 may include a heated metal structure or other equipment with exposed curved surfaces such as curved surface 110. Optical material 108 (e.g., glass, plastic, ceramic, etc.) may be placed on top of surface 110 while slumping equipment 106 is heated. When equipment 106 reaches a sufficiently high temperature, optical material 108 will slump under its own weight, thereby creating optical structures with curved surfaces such as optical structures 112. Following cooling, structures 112 may be removed from slumping equipment 106. As shown on the right-hand side of FIG. 8, the resulting shape for optical structures 112 may have curved surfaces such as curved upper surface 114 and curved lower surface 116.

Figure 9:
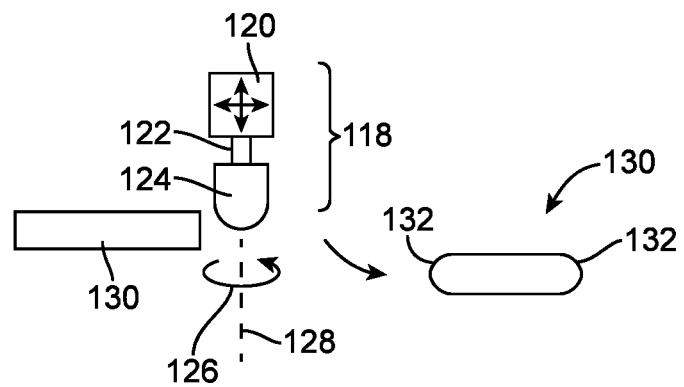
FIG. 9 is a diagram showing how a machining process may be used to form display structures such as glass structures with curved surfaces in accordance with an embodiment of the present invention.

FIG. 9 is a diagram showing how a machining process may be used to form display structures such as glass structures with curved surfaces. As shown in FIG. 9, optical material 130 may be processed using machining equipment 118. Machining equipment 118 may have a machining head such as head 124 (e.g., a drill bit, milling cutter, or other machining tool). Actuator 120 may use shaft 122 to rotate head 124 in direction 126 about rotational axis 128. Actuator 120 may include a motor for rotating shaft 122 and computer-controlled positioners for adjusting the location of shaft 122 and head 124 relative to optical material 130. Following machining of the edges or other portions of optical structures 130, optical structures 130 may have curved surfaces such as curved surfaces 132, as shown on the right-hand side of FIG. 9.

By providing optical structures in display 14 with curved edges or other curved or angled surfaces, the optical structures may bend light that is emitted from display pixels 86 in a way that allows the light to extend laterally outward over the otherwise inactive portions of the display. As a result, it will appear to a user of the display as if the display is borderless or nearly borderless.

Figure 10:
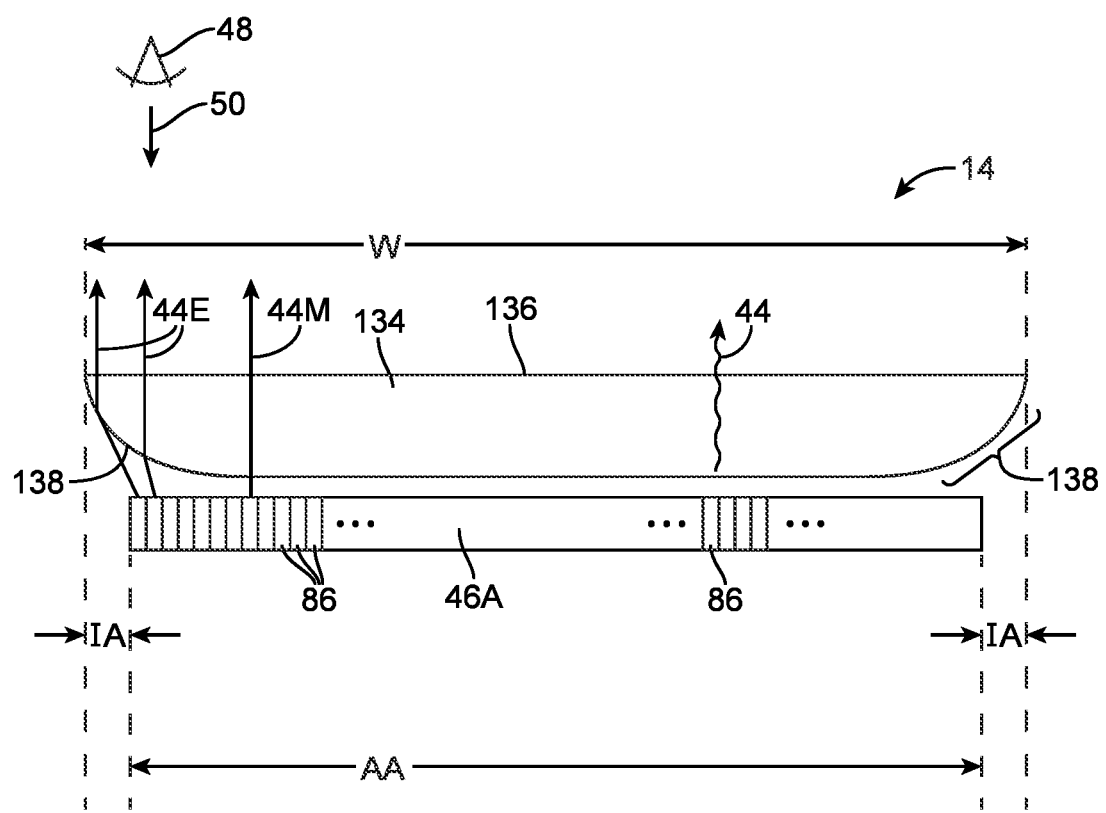
FIG. 10 is a cross-sectional side view of an illustrative display with a glass layer having a curved portion along the edge of a lower surface for bending light produced by an array of display pixels and thereby creating a borderless appearance for the display in accordance with an embodiment of the present invention.

An illustrative display of the type that may use curved optical structures to achieve a borderless or near borderless appearance to a viewer is shown in FIG. 10. As shown in the cross-sectional side view of display 14 in FIG. 10, display 14 may include active area display layers such as active display structures 46A. Inactive display structures such as inactive display structures 46I of FIG. 6 are not shown. Active area display structures 46A may contain a rectangular array of display pixels such as display pixels 86 with a rectangular peripheral edge. Light rays 44 associated with display pixels may be produced by a backlight unit (e.g., a backlight unit in a display such as a backlit liquid crystal display), may be produced by light reflected off of a reflector such as reflector 80 of FIG. 5, or may be emitted by light-emitting diode structures or other light sources within display pixels 86.

Optical structures 134 (e.g., optical structures of the type formed using the equipment of FIGS. 7, 8, and 9 or other equipment) may be formed from transparent optical members. For example, a display may be provided with an optical structure such as a transparent member formed from glass, plastic, ceramic, or other clear material. An optical member such as optical member 134 of FIG. 10 may have planar surfaces such as upper surface 136 (in the example of FIG. 10) and may have curved surfaces such as curved surfaces 138. Curved surfaces may be located on the upper and/or lower side of optical member 134. As shown in FIG. 10, for example, curved surfaces 138 may be located in peripheral edge portions of optical member 134 (e.g., the left and right edges of member 134 and, if desired, the upper and lower edges of member 134, as viewed from above in direction 50 by viewer 48).

Curved surfaces 138 may allow optical structures such as member 134 to serve as light bending structures to bend light 44 from active display structures 46A so that the entire lateral expanse of display 14 appears to be filled with active image content. Display 14 may, for example, appear to have no left and right borders (when viewed in direction 50) and/or may additionally have no upper and lower borders (when viewed in direction 50). The lateral dimensions (in X and Y) for active display structures 46A are less than the respective lateral dimensions X and Y of optical member 134, so the apparent image size for display 14 is enlarged. By enlarging the apparent size of the display, the display may be made to appear borderless or nearly borderless, even if active display structures 46A are surrounded by a border of inactive structures such as structures 46B.

Rays of light from active display structures 46A such as light ray 44M are produced by display pixels 86 that are near to the center of display 14. In this portion of display 14, light may travel vertically upwards to viewer 48 without significant bending. Near to the peripheral edges of active display structures 46A, light rays such as light rays 44E are emitted that are bent by the curved nature of the edges of optical structures 134 (i.e., curved surfaces 138).

As shown by the bent trajectory of light rays 44E, light rays 44E that are emitted by display pixels 86 along the edges of active display structures 46A may, upon passing through optical structures 134, appear to viewer 48 as if they were emitted by display pixels located in inactive border region IA. The lateral extent (e.g., width W in FIG. 10) of display 14 over which light rays 44 are emitted and therefore the effective size of display 14 for displaying content to viewer 48 is enhanced by the presence of curved portions 138 of optical member 134, so it appears as if display 14 has an active area of lateral dimension W, rather than the more limited size of active area AA that is associated with the physical size of the array of display pixels 86 in structures 46A. In this way, surface 136 can be entirely covered with active display pixel content (e.g., graphics, text, video, etc.), providing display 14 with a borderless or nearly borderless appearance, despite the presence of display control circuitry and other inactive structures in inactive region 46I of display structures 46 (FIG. 6).

In the illustrative example of FIG. 10, optical structures 134 have curved surfaces 138 that are located on the lower side of structures 134 near the peripheral edge of structures 134. Structures 134 may have a rectangular shape when viewed in direction 50 (i.e., structures 134 may be formed from a rectangular sheet of optical material or other planar member with curved edge surfaces). One or more, two or more, three or more, or four of the edges of rectangular optical structures 134 may be provided with curved surfaces such as surfaces 138.

Figure 11:
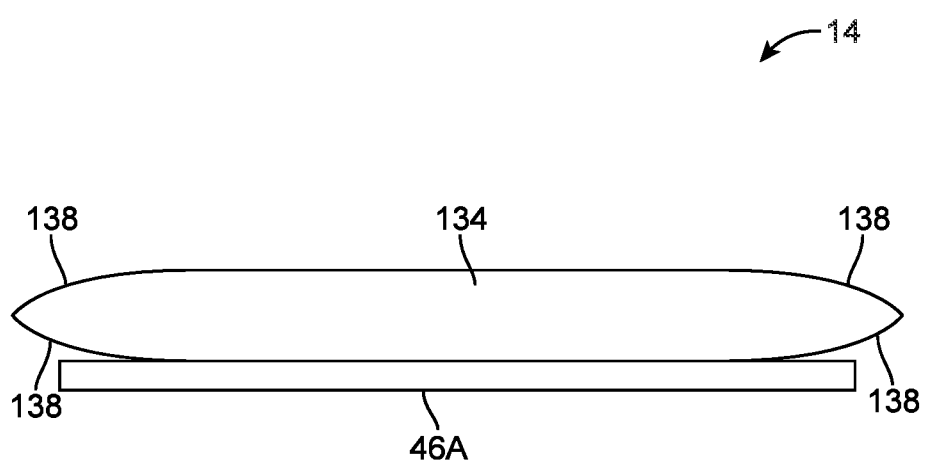
FIG. 11 is a cross-sectional side view of an illustrative display with a glass layer having curved upper and lower surfaces along the edge of the glass layer for bending light produced by an array of display pixels and thereby creating a borderless appearance for the display in accordance with an embodiment of the present invention.

If desired, both the upper and lower sides of optical structures 134 may be provided with curved surfaces such as curved surfaces 138, as shown in FIG. 11. Curved surfaces 138 may cover some or all of the upper and lower surfaces of structures 134. In the example of FIG. 11, curved surfaces 138 are formed in peripheral portions of optical structures 134, but not in the central portions of structures 134. The center portions of the upper and lower surface of optical structures 134 may be planar.

Figure 12:
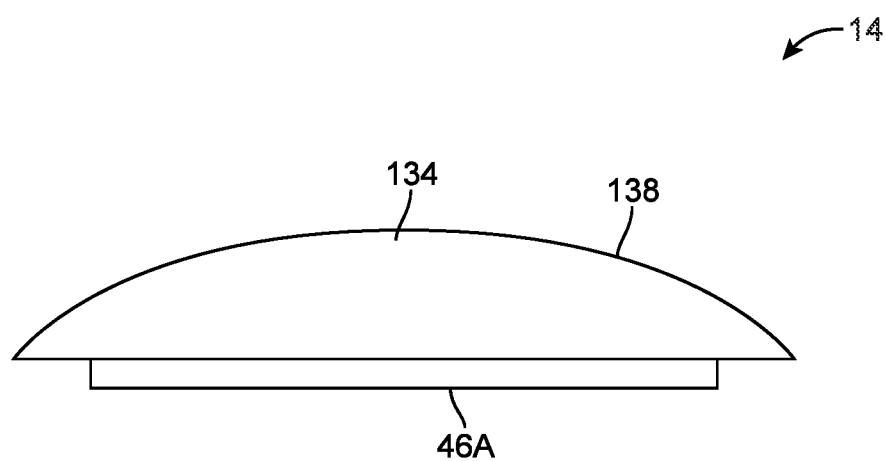
FIG. 12 is a cross-sectional side view of an illustrative display with a glass layer having a convex curved upper surface for bending light produced by an array of display pixels and thereby creating a borderless appearance for the display in accordance with an embodiment of the present invention.

FIG. 12 shows how the upper surface of optical structures 134 may be provided with a curved (convex) shape using upper curved surface 138. The lower surface of optical structures 134 in this type of configuration may be planar (as an example).

Figure 13:
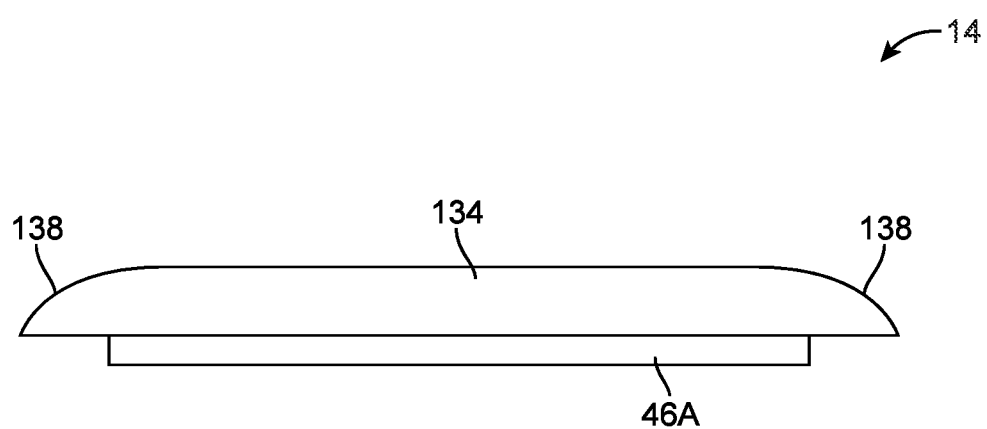
FIG. 13 is a cross-sectional side view of an illustrative display with a glass layer having edges with curved upper surfaces for bending light produced by an array of display pixels and thereby creating a borderless appearance for the display in accordance with an embodiment of the present invention.

In the configuration of FIG. 13, display 14 has been provide with optical structures 134 that have an upper surface with a planar central region and curved peripheral edge portions 138. The lower surface of optical structures 134 may be planar.

Figure 14:
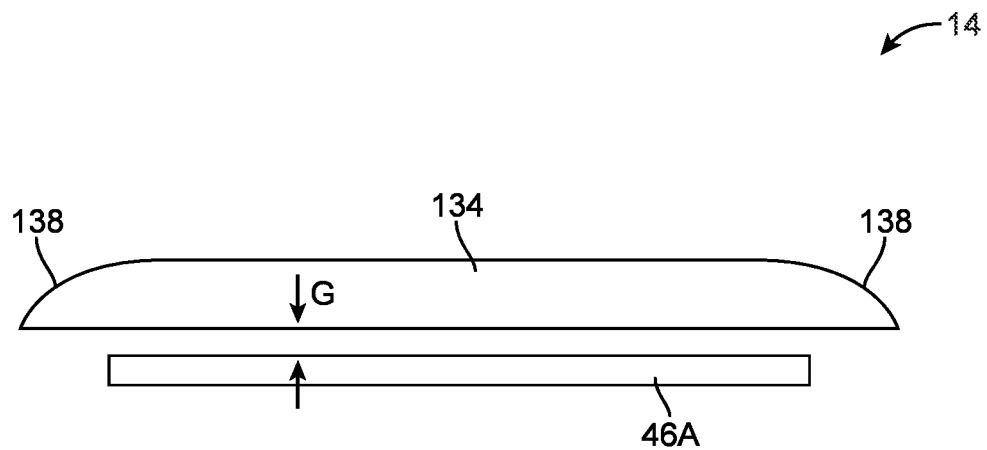
FIG. 14 is a cross-sectional side view of an illustrative display with a glass layer having edges with curved upper surfaces for bending light produced by an array of display pixels that is separated from the glass layer by a gap and thereby creating a borderless appearance for the display in accordance with an embodiment of the present invention.
Figure 15:
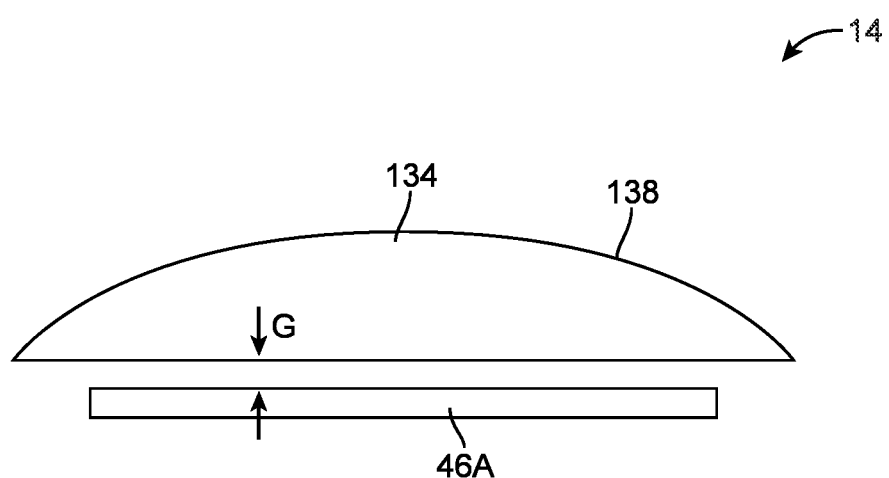
FIG. 15 is a cross-sectional side view of an illustrative display with a glass layer having a convex curved upper surface for bending light produced by an array of display pixels that is separated from the glass layer by a gap and thereby creating a borderless appearance for the display in accordance with an embodiment of the present invention.

Optical structures 134 may be mounted against active display structures 46A or may be mounted so that an air gap or a gap filled with materials other than air is formed between optical structures 134 and active display structures 46A. FIG. 14 is a cross-sectional side view of display 14 in a configuration in which optical structures 134 have been mounted so that there is an air gap G between optical structures 134 and display structures 46A. In FIG. 14, the center of the upper surface of optical structures 134 is planar. FIG. 15 is a cross-sectional side view of display 14 in a configuration in which optical structures 134 with a curved upper surface (surface 138) have been separated from display structures 46A by an air gap of size G.

Optical structures 134 (e.g., glass, plastic, or ceramic optical members of the types described in connection FIGS. 10-15) may be mounted on the exterior of device 10 or in the interior of device 10. When mounted as the outermost structural display layer in device 10, optical structures 134 may sometimes be referred to as a display cover layer or display cover layer structures. When mounted in the interior of device 10, optical structures 134 may be covered by one or more additional layers of transparent material such as a display cover layer and/or other layers of clear material.

Figure 16:
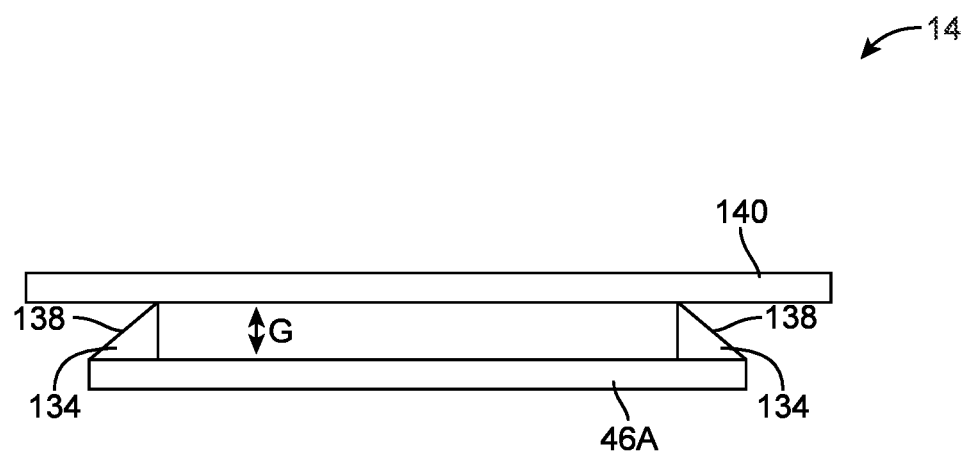
FIG. 16 is a cross-sectional side view of an illustrative display with a display cover layer and optical structures with angled surfaces for bending light produced by an array of display pixels and thereby creating a borderless appearance for the display in accordance with an embodiment of the present invention.

FIG. 16 is a cross-sectional side view of display 14 in an illustrative configuration in which optical structures 134 have been covered by additional optical structures such as display cover layer 140. Display cover layer 140 may be a layer of transparent material such as a clear layer of plastic, glass or ceramic (as examples). Light bending optical structures 134 of FIG. 16 have been formed from glass, plastic, or other clear material with a shape that exhibits a triangular cross-section (i.e. a shape with sloped surfaces 138). Sloped surfaces 138 may form planar or non-planar curved surfaces for bending light. Air gap G may separate the lower surface of display cover layer 140 and the upper surface of display structures 46A. Optical structures 134 of FIG. 16 may run along the right and left edges of display 14 (e.g., make display 14 appear borderless along its right and left edges), may run around the entire periphery of display 14 (e.g., structures 134 may have a rectangular ring shape with a central opening that makes display 14 appear borderless along all four of its edges), or may be configured to cover other portions of the edges of display 14.

Figure 17:
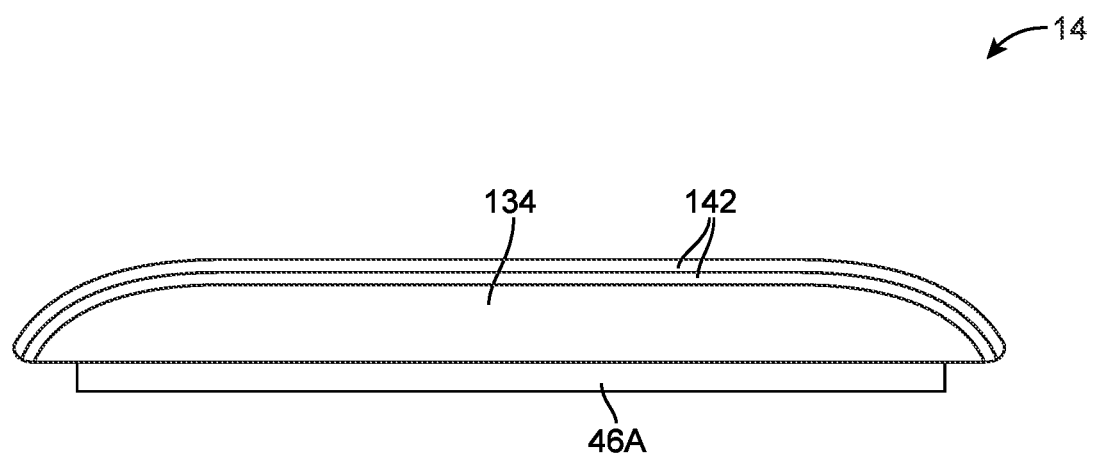
FIG. 17 is a cross-sectional side view of an illustrative display with a glass layer that is covered with one or more coating layers and that has an upper surface with curved edge regions for bending light produced by an array of display pixels and thereby creating a borderless appearance for the display in accordance with an embodiment of the present invention.

As shown in FIG. 17, optical structures 134 may be provided with optical coating layers such as layers 142. Layers 142 may be formed from dielectrics such as sputtered oxides, from clear materials deposited using physical vapor deposition, chemical vapor deposition, or other deposition techniques (e.g., coatings of glass, polymer, ceramic, or other materials), or may be formed from other transparent coating layers on optical structures 134. There may be one or more layers 142, two or more layers 142, three or more layers 142, or four or more layers 142. Layers 142 may include layers such as antireflection layers, antismudge layers, antiscratch layers, or other layers to modify the properties of the upper and/or lower surface of optical structures 134.

Figure 18:
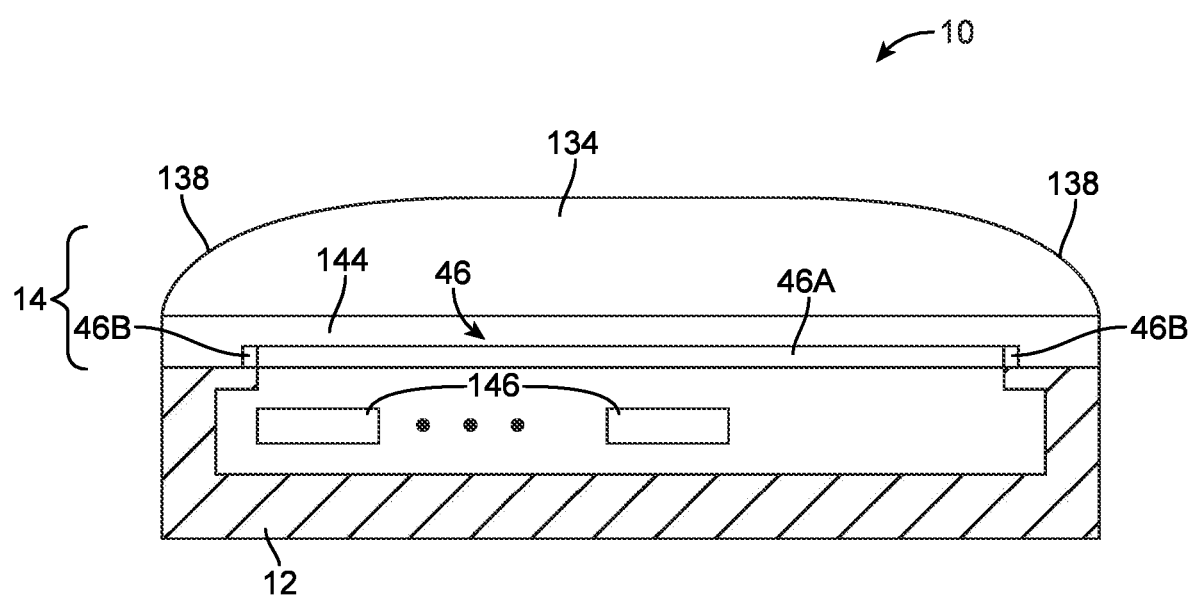
FIG. 18 is a cross-sectional side view of an illustrative display having a glass layer with a curved upper surface for bending light produced by an array of display pixels and having a layer of clear material such as solidified liquid polymer interposed between the glass layer and array of display pixels in accordance with an embodiment of the present invention.

It may be desirable to use optically clear support structures such as layers of cured clear adhesive (transparent solidified liquid polymer) to support optical structures 134. As shown in FIG. 18, for example, device 10 may have a clear polymer layer such as polymer structure 144 for supporting optical structures 134. Components 146 may be mounted within housing 12. Display structures 46 may be mounted on support structures such as portions of housing 12 or other structures. To provide display 14 with a borderless or nearly borderless appearance, optical structures 134 may have curved surfaces such as curved surfaces 138. Polymer material 144 may be formed from a cured optical adhesive (e.g., optically clear adhesive). Initially, when in an uncured liquid state, polymer 144 may be placed on top of display structures 46 (e.g., by dripping, screen printing, spraying, etc.) Optical structures 134 may then be placed on top of the liquid polymer. Ultraviolet light curing or thermal curing techniques may then be used to cure the polymer material to form solid polymer support structures such as structures 144 of FIG. 18.

Structures 144 of FIG. 18 may support optical structures 134 and may hold structures 134 at a desired distance from display structures 46 such as active display structures 46A and may help attach optical structures 134 to device 10. Polymer material 144 may, if desired, have a relatively low index of refraction compared to the index of refraction of optical structures 134. For example, optical structures 134 may be formed from a material such as glass with an index of refraction of 1.4 or above (e.g., 1.4 to 1.8), whereas polymer material 144 may have an index of refraction of less than 1.4, less than 1.3, less than 1.2, or less than 1.1 (e.g., 1.0 to 1.2). In this way, polymer material 144 may behave optically as an air gap, allowing light 44 to be bent effectively by curved surfaces 138 of optical structures 134.

Figure 19:
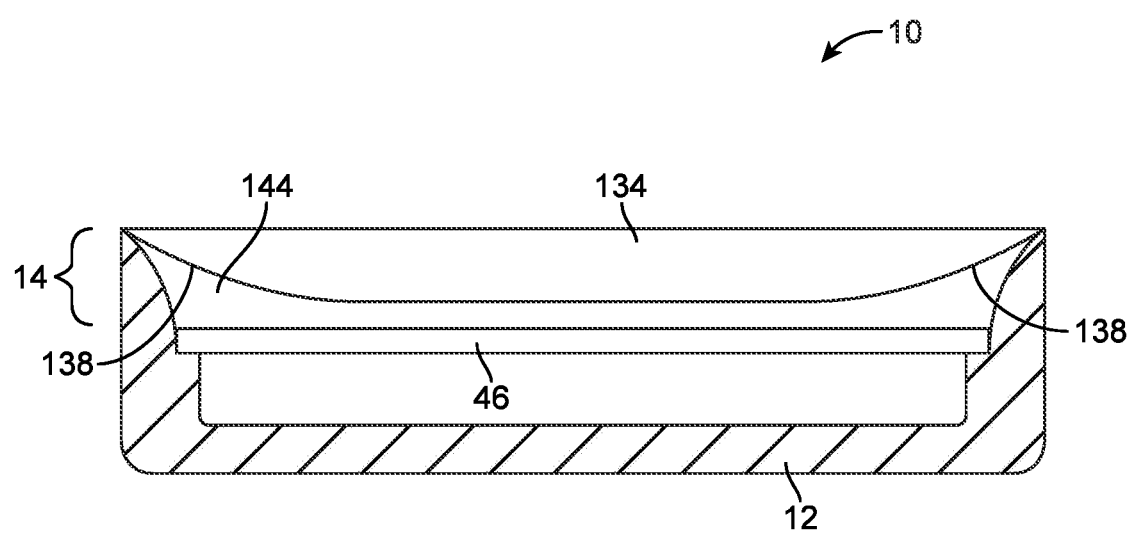
FIG. 19 is a cross-sectional side view of an illustrative display having a glass layer with a curved lower surface for bending light produced by an array of display pixels and having a layer of clear material such as solidified liquid polymer interposed between the glass layer and array of display pixels in accordance with an embodiment of the present invention.

FIG. 19 is a cross-sectional side view of device 10 in a configuration in which curved surfaces 138 of optical structures 134 have been formed on the lower surface of optical structures 134, adjacent to solidified liquid polymer material 144.

Figure 20:
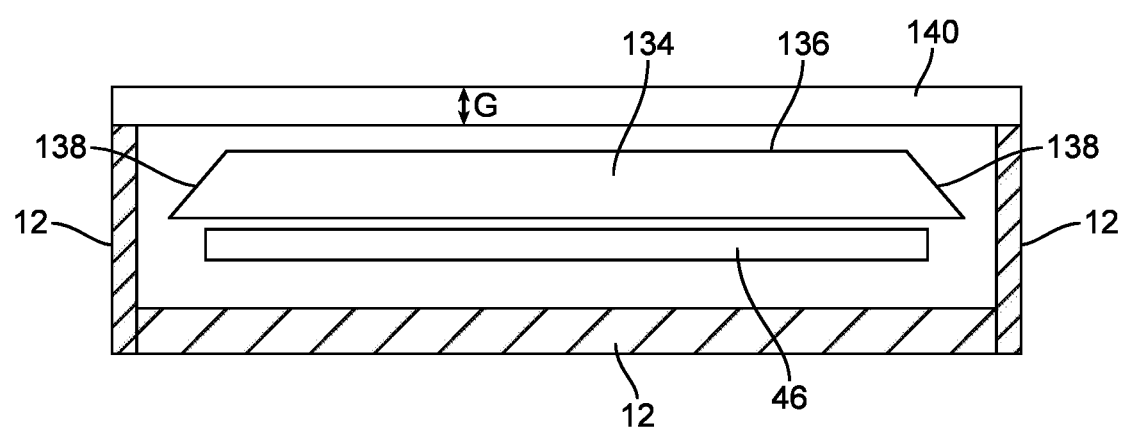
FIG. 20 is a cross-sectional side view of an illustrative display having a glass layer with a curved surface for bending light produced by an array of display pixels and having a planar display cover layer in accordance with an embodiment of the present invention.

In the illustrative configuration of FIG. 20, optical structures 134 have been covered with a layer of transparent material such as display cover layer 140. Display cover layer 140 may be a planar sheet of glass, plastic, or ceramic. Optical structures 134 may have a planar upper surface such as upper surface 136. Angled edge surfaces 138 may lie in planes that are not coplanar with upper surface 136 to allow the edges of optical structures 134 to bend light from display structures 46. Air gaps such as gap G may separate optical structures such as optical structures 134 of FIG. 20 or other optical structures 134 from display cover layer 140 and/or polymer such as polymer 144 may be interposed between display cover layer 140 and optical structures 134 and/or between optical structures 134 and display structures 46.

If desired, device 10 may be provided with touch sensor functionality. A touch sensor for device 10 may be implemented using an array of capacitive touch sensor electrodes (e.g., transparent conductive electrodes such as indium tin oxide electrodes), may use resistive touch technology, light-based touch sensors, acoustic touch sensor technology, or other touch sensor technology. As an example, a capacitive touch sensor for device 10 may be implemented using a one-sided or two-sided array of indium tin oxide electrodes. The electrodes may be formed on a touch sensor substrate such as a layer of glass or plastic that is separate from other layers in display 14 (e.g., a touch sensor substrate that is mounted within display 14 using adhesive) or may be formed on the surface of optical structures 134, display cover layer 140, or other structures in display 14.

Figure 21:
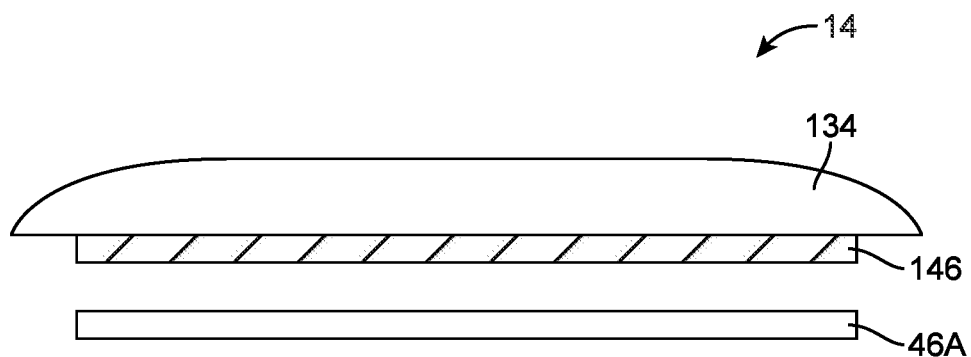
FIG. 21 is a cross-sectional side view of an illustrative display having a glass layer with a curved surface for bending light produced by an array of display pixels and having a touch sensor located on a lower surface of the glass layer in accordance with an embodiment of the present invention.

FIG. 21 is a cross-sectional side view of display 14 in a configuration in which touch sensor 146 has been formed on the lower surface of optical structures 134. An air gap or polymer gap may separate touch sensor 146 from display structures 46A. Touch sensor 146 may include capacitive touch sensor structures such as a one-layer or two-layer array of indium tin oxide electrodes. The indium tin oxide electrodes may be formed directly on the lower surface of optical structures 134 or may be formed on a substrate (e.g., a sheet of glass or polymer) that is attached to the underside of optical structures 134 by adhesive (as examples). An air gap or a gap filled with polymer 144 may separate display structures 46A from touch sensor 146.

Figure 22:
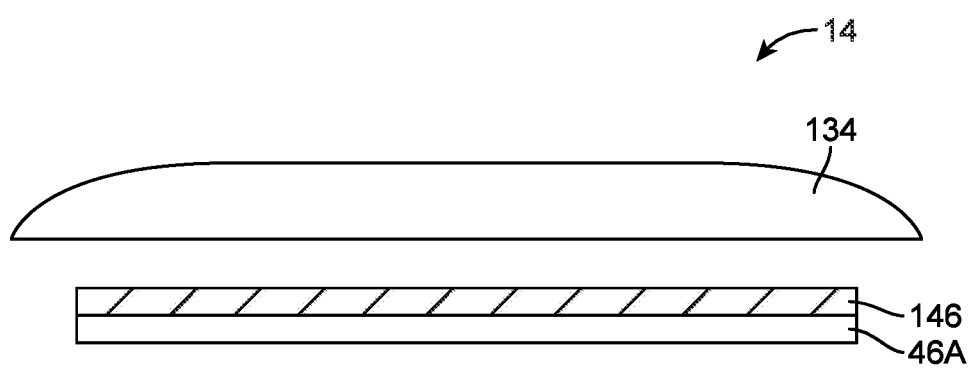
FIG. 22 is a cross-sectional side view of an illustrative display having a glass layer with a curved surface for bending light produced by an array of display pixels and having a touch sensor located on an upper surface of the array of display pixels in accordance with an embodiment of the present invention.

In the illustrative configuration of FIG. 22, touch sensor 146 has been formed on the surface of display structures 46A (e.g., by attaching a touch panel with a thin glass or polymer substrate to display structures 46A with adhesive).

Figure 23:
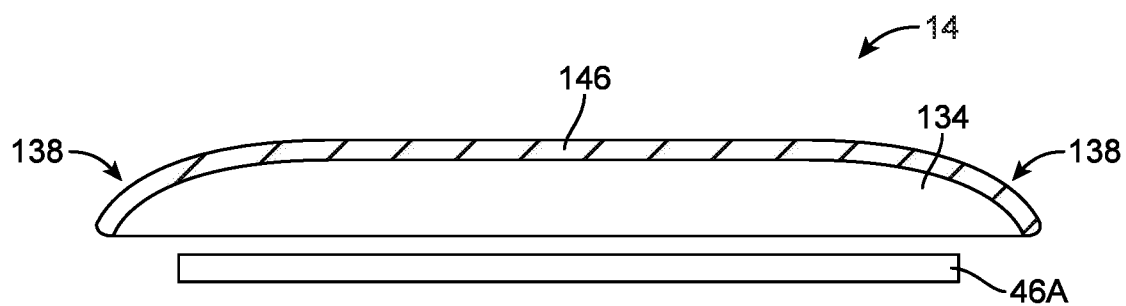
FIG. 23 is a cross-sectional side view of an illustrative display having a glass layer with a curved surface for bending light produced by an array of display pixels and having a touch sensor located on an upper surface of the glass layer in accordance with an embodiment of the present invention.

FIG. 23 is a cross-sectional side view of display 14 in a configuration in which touch sensor 146 has been formed on the upper surface of optical structures 134. Touch sensor 146 may have portions that are bent to conform to the shape of curved surfaces 138 of optical structures 134.

Figure 24:
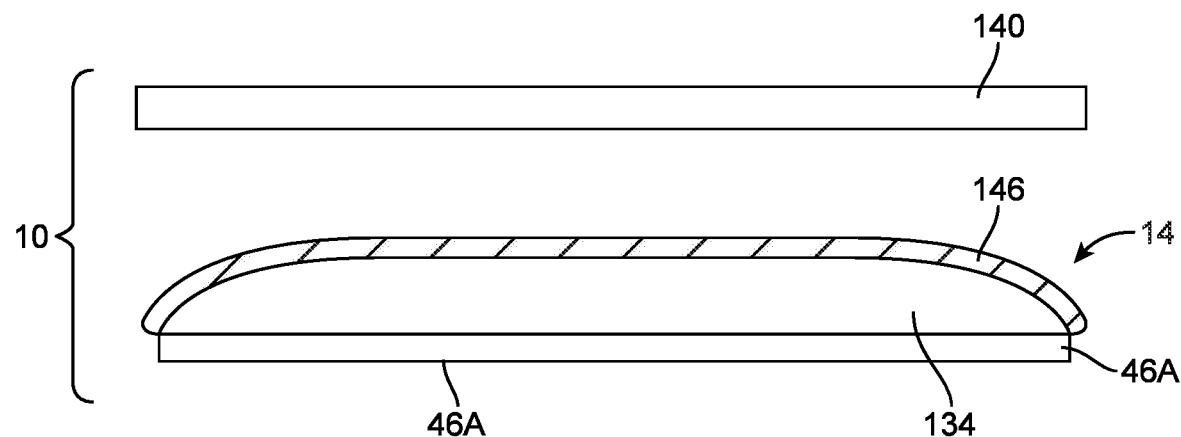
FIG. 24 is a cross-sectional side view of an illustrative display having a glass layer with a curved surface for bending light produced by an array of display pixels and having a touch sensor located on an upper surface of the glass layer under an associated display cover layer in accordance with an embodiment of the present invention.

FIG. 24 is a cross-sectional side view of display 14 in a configuration in which touch sensor 146 has been formed on the upper surface of optical structures 134 and in which device 10 has a display cover layer such as cover layer 14. Cover layer 140 may be separated by an air gap or a gap filled with polymer 144 from touch sensor 146 and optical structures 134.

Figure 25:
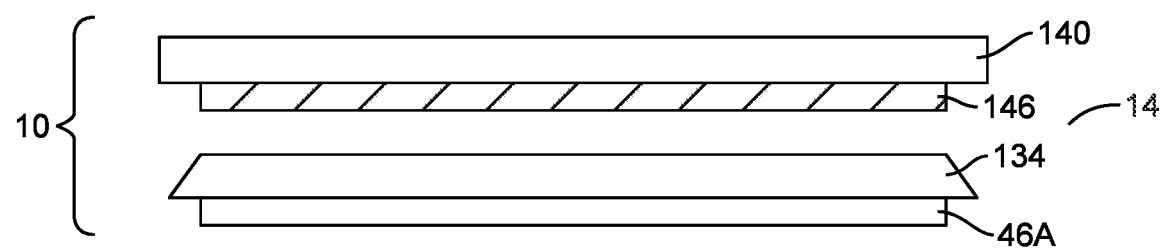
FIG. 25 is a cross-sectional side view of an illustrative display having a glass layer with a curved surface for bending light produced by an array of display pixels and having a touch sensor located on a lower surface of an associated display cover layer in accordance with an embodiment of the present invention.

FIG. 25 is a cross-sectional side view of display 14 in a configuration in which touch sensor 146 has been formed on the underside of display cover layer 140 (either as layers deposited directly on display cover layer 140 or as a touch panel that is attached to display cover layer 140 with adhesive). An air gap or a gap filled with polymer 144 may separate touch sensor 146 of FIG. 25 from optical structures 134.

The foregoing is merely illustrative of the principles of this invention and various modifications can be made by those skilled in the art without departing from the scope and spirit of the invention.

What is claimed is:

1. An electronic device, comprising:
   an organic light-emitting diode display layer having an active area that emits light and that is surrounded by an inactive border region;
   a housing having a back surface opposite the organic light-emitting diode display layer, wherein the housing comprises sidewall portions;
   a transparent display cover layer that has first and second opposing surfaces, wherein the first surface has a flat portion that defines a plane and overlaps the active area, wherein the first surface has a curved portion that curves out of the plane and overlaps the inactive border region, and wherein the transparent display cover layer redirects at least some of the light emitted by the active area to the curved portion over the inactive border region; and
   a transparent layer interposed between the active area and the transparent display cover layer, wherein the inactive border region of the organic light-emitting diode display layer, at least one of the sidewall portions of the housing, the curved portion of the transparent display cover layer, and the transparent layer all overlap.

2. The electronic device defined in claim 1 wherein the first surface is an inner surface that faces the organic light-emitting diode display layer, and the second surface is an outer surface.

3. The electronic device defined in claim 2 wherein the inactive border region of the organic light-emitting diode display layer overlaps the curved portion of the first surface of the transparent display cover layer, the transparent layer, and the sidewall portions of the housing.

4. The electronic device defined in claim 3 wherein the transparent display cover layer has a first width and wherein the organic light-emitting diode display layer has a second width that is smaller than the first width.

5. The electronic device defined in claim 4 wherein the curved portion of the transparent display cover layer is convex to guide at least some of the light emitted by the organic light-emitting diode display layer to have a viewable width that is greater than the second width.

6. The electronic device defined in claim 2 wherein the curved portion of the inner surface is convex, and a part of the convex curved portion overlaps the organic light-emitting diode display layer.

7. The electronic device defined in claim 6 wherein the transparent layer is a layer of optically clear adhesive that adheres the organic light-emitting diode display layer to the inner surface of the transparent display cover layer.

8. The electronic device defined in claim 7 wherein the optically clear adhesive extends from a first one of the housing sidewall portions to a second one of the housing sidewall portions.

9. The electronic device defined in claim 7 wherein the transparent display cover layer has a first index of refraction, and wherein the layer of optically clear adhesive has a second index of refraction that is less than the first index of refraction.

10. The electronic device defined in claim 1 wherein the second surface is an inner surface that faces the organic light-emitting diode display layer, and the first surface is an outer surface.

11. The electronic device defined in claim 10 wherein the curved portion of the outer surface is convex, and wherein a portion of the convex curved portion overlaps the organic light-emitting diode display layer.

\* \* \* \* \*